United States Patent
Burrell et al.

(10) Patent No.: US 7,037,824 B2
(45) Date of Patent: May 2, 2006

(54) COPPER TO ALUMINUM INTERLAYER INTERCONNECT USING STUD AND VIA LINER

(75) Inventors: Lloyd G. Burrell, Poughkeepsie, NY (US); Edward E. Cooney, III, Jericho, VT (US); Jeffrey P. Gambino, Westford, VT (US); John E. Heidenreich, III, Yorktown Heights, NY (US); Hyun Koo Lee, LaGrangeville, NY (US); Mark D. Levy, Essex Junction, VT (US); Baozhen Li, South Burlington, VT (US); Stephen E. Luce, Underhill, VT (US); Thomas L. McDevitt, Underhill, VT (US); Anthony K. Stamper, Williston, VT (US); Kwong Hon Wong, Wappingers Falls, NY (US); Sally J. Yankee, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/844,533

(22) Filed: May 13, 2004

(65) Prior Publication Data
US 2004/0207092 A1 Oct. 21, 2004

Related U.S. Application Data

(62) Division of application No. 09/805,027, filed on Mar. 12, 2001.

(51) Int. Cl.
*H01L 21/4763* (2006.01)

(52) U.S. Cl. ............... 438/627; 438/629; 438/643; 438/648; 438/653; 438/687

(58) Field of Classification Search ........ 438/612–614, 438/622, 625, 627, 629, 637, 643, 648, 650, 438/653, 656, 672, 675, 687
See application file for complete search history.

(56) References Cited

U.S. PATENT DOCUMENTS

| | | | |
|---|---|---|---|
| 5,313,089 A | 5/1994 | Jones, Jr. |
| 5,470,788 A | 11/1995 | Biery et al. |
| 5,565,707 A | 10/1996 | Colgan et al. |
| 5,691,572 A | 11/1997 | Chung |
| 5,714,418 A | 2/1998 | Bai et al. |
| 5,739,579 A | 4/1998 | Chiang et al. |
| 5,798,299 A | 8/1998 | Chung |
| 5,801,098 A | 9/1998 | Fiordalice et al. |
| 5,808,364 A | 9/1998 | Cronin et al. |
| 5,814,557 A | 9/1998 | Venkatraman et al. |
| 5,858,873 A | 1/1999 | Vitkavage et al. |
| 5,889,328 A | 3/1999 | Joshi et al. |
| 5,897,349 A | 4/1999 | Agnello |
| 5,913,147 A | 6/1999 | Dubin et al. |

(Continued)

*Primary Examiner*—Kevin M. Picardat
(74) *Attorney, Agent, or Firm*—Whitham, Curtis, Christofferson & Cook, PC; Yuanmin Cai

(57) ABSTRACT

Tungsten studs of a size comparable to vias are provided to integrate and interface between copper and aluminum metallization layers in an integrated circuit and/or package therefor by lining a via opening, preferably with layers of tantalum nitride and PVD tungsten as a barrier against the corrosive effects of tungsten fluoride on copper. The reduced size of the tungsten studs relative to known interface structures allows wiring and connection pads to be formed in a single aluminum layer, improving performance and reducing process time and cost.

7 Claims, 2 Drawing Sheets

U.S. PATENT DOCUMENTS

| | | |
|---|---|---|
| 5,933,758 A | 8/1999 | Jain |
| 5,945,155 A | 8/1999 | Grill et al. |
| 5,976,975 A | 11/1999 | Joshi et al. |
| 5,981,374 A | 11/1999 | Dalal et al. |
| 6,004,188 A | 12/1999 | Roy |
| 6,016,012 A | 1/2000 | Chatila et al. |
| 6,025,264 A | 2/2000 | Yew et al. |
| 6,037,664 A | 3/2000 | Zhao et al. |
| 6,054,380 A | 4/2000 | Naik |
| 6,261,950 B1 | 7/2001 | Tobben et al. |
| 6,265,781 B1 | 7/2001 | Andreas |
| 6,277,761 B1 | 8/2001 | Diewald et al. |
| 6,342,734 B1 | 1/2002 | Allman et al. |
| 6,399,486 B1 | 6/2002 | Chen et al. |
| 6,417,092 B1 | 7/2002 | Jain et al. |
| 6,531,389 B1 | 3/2003 | Shue et al. |
| 6,548,343 B1 * | 4/2003 | Summerfelt et al. ........ 438/240 |
| 2001/0054769 A1 | 12/2001 | Raajimakers et al. |
| 2002/0102809 A1 | 8/2002 | Barth et al. |

* cited by examiner

COPPER TO ALUMINUM INTERLAYER INTERCONNECT USING STUD AND VIA LINER

RELATED APPLICATION

This application is a division of co-pending application Ser. No. 09/805,027, filed Mar. 12, 2001 which is fully incorporated herein by reference.

BACKGROUND OF THE INVENTION

1. Field of the Invention

The present invention generally relates to semiconductor integrated circuit chips and packages therefor and, more particularly, to interlayer interconnects and fine pitch intralevel interconnects in the connection pad layer in semiconductor integrated circuits and packages therefor.

2. Description of the Prior Art

Extremely high integration density has been pursued in recent years due to the increases in performance due to reduced signal propagation time as well as increased functionality and increased economy of manufacture. Nevertheless, integrated circuit complexity is primarily limited by the ability to make a sufficient number of power and signal connections to and from a given chip to a package and vice-versa. The same limitation applies to the interface of the package and the board or device in which the package is included. Since a chip of sufficient complexity to require only power, data and control inputs and outputs (e.g. a system-on-a-chip) is not generally available at the present time (except as relatively simple application specific integrated circuits (ASICs)), many hundreds if not thousands of connections between a chip and its packaging are generally required. Numerous wire bonding and solder preform techniques (e.g. C4) are well-known for making such numerous and closely spaced connections with high reliability.

However, to increase signal propagation speed and enhance the effects of extremely high integration density, the use of copper wiring interconnects on the chip and in packaging has become the metallurgy of choice for high performance devices. At the same time, aluminum metallurgy is preferred for final interconnect and so-called distribution layer interconnections due to the ability of forming extremely fine interconnects at fine pitch and in close proximity with each other where the interconnects can be encapsulated to eliminate significant metal migration. Further, aluminum metallurgy is preferred for chip and package solder and wire bonding connection pads. Wire bond and C4 solder connections are considered to require a last metal connection pad layer of aluminum due to, at least, the solubility of copper in solder materials and other metals causing the development of undesired structures or damaging effects as copper precipitates upon cooling.

To integrate aluminum wiring and pad metal levels with lower copper wiring metal layers, it has been necessary to form large copper plugs or pads overlaid by a large aluminum via and a large aluminum pad to make connections to aluminum layers. However, such a large pad effectively prevents interconnection wiring from being provided in the same aluminum layer, at least in the numbers and complexity of interconnections generally required for many integrated circuits at the present time.

For connection between aluminum wiring and/or pad levels, vias much smaller than the copper and aluminum pad and via interface structures can be used. Tungsten has become a metal of choice for such vias or studs between aluminum metallurgy layers and suitable tungsten via/stud formation processes are well-known. Tungsten studs have generally been used for their low resistivity, good reliability and good adhesion to aluminum. However, tungsten fluoride ($WF_6$) must be used for chemical vapor deposition processes to deposit the tungsten studs in vias of the chip or package.

Unfortunately, tungsten fluoride tends to attack copper causing corrosion and some potentially significant and uncontrolled etching of the copper. This effect can unpredictably cause reduction in manufacturing yield and/or variation of device electrical properties. Certainly, processes which allow for uncontrolled chemical processes to take place will not support foreseeable increases in integration density and smaller sizes and finer pitches of copper connections. For this and other possible reasons, tungsten studs have not been used to connect to copper It should be understood that the formation of a metal layer is a time-consuming process; adversely affecting tool throughput and productivity. Further, there is a large economic cost associated with the duration of such processes and tool and facility amortization represents a substantial fraction of device cost. These problems are aggravated by the fact that copper processes, per level, are more time-consuming than aluminum layer processes for suitable interconnects made below the copper to aluminum interface structure layer. Moreover, it should be recognized that the copper to aluminum interface structures require essentially the same pattern to be formed in two separate metal layers which, together, have the sole function of altering metallurgy to accommodate solder and wire bonding connections at yet another metal layer level.

This cost of copper processes may be well-justified at lower interconnect layers where signals are being communicated between active devices on the chip and where critical paths are much more likely to exist for correct functioning of the overall integrated circuit. However, once the full functionality of the chip has been achieved, leading signals on and off the chip is much less critical and the additional delay is generally small relative to the overall path length to be traversed between chips. By the same token, the processing time required for provision of a copper wiring layer (for optimum device performance), together with an aluminum layer represents a significant portion of the total wafer processing time for a state of the art, high density integrated circuit chip or wafer. Therefore, the costs per chip of known structures for integration of copper and aluminum may be substantial for each chip but have been unavoidable when performance requirements have left no alternative to integration of copper and aluminum.

SUMMARY OF THE INVENTION

It is therefore an object of the present invention to provide a technique of integrating copper and aluminum utilizing tungsten studs which avoids attack of the copper by the tungsten deposition process.

It is another object of the invention to provide for integration of copper and aluminum wiring in an integrated circuit chip utilizing a single aluminum layer for both connection pads and interconnect wiring.

In order to accomplish these and other objects of the invention, an integrated circuit is provided including a patterned copper layer, a patterned aluminum layer, a stud connection in an opening between the patterned copper layer and the aluminum layer, and a liner in the opening and extending between the stud and the patterned copper layer.

In accordance with another aspect of the invention, a method of forming an interface structure between copper and aluminum metallurgy layers in an integrated circuit is provided comprising steps of covering a copper metallurgy layer with an insulator, forming a opening through the insulator to the copper metallurgy layer, forming a liner of a conductive barrier material in the opening, filling a remainder of the opening with a conductive material to form a stud, and forming a patterned aluminum metallurgy layer over the stud.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
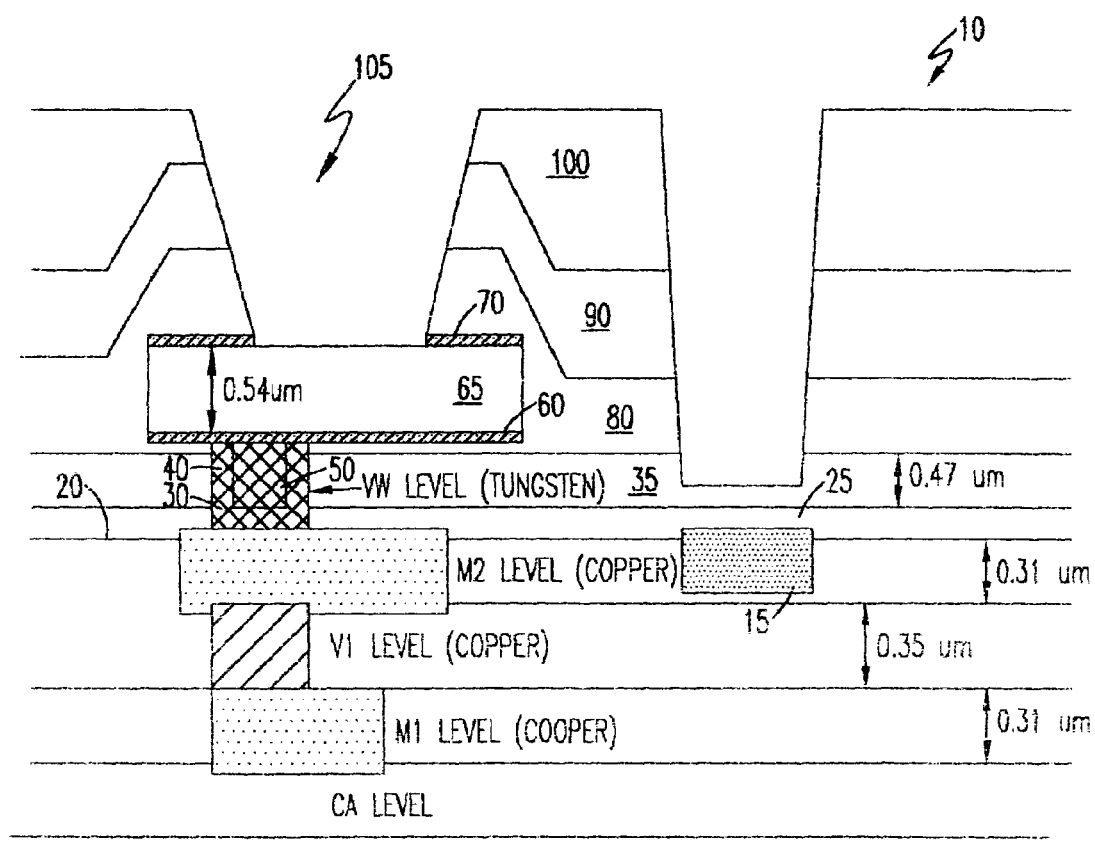
FIG. 1 is a cross-sectional view of a first, generalized embodiment of the invention.

Referring now to the drawings, and more particularly to FIG. 1, there is shown, in cross-section, a generalized embodiment 10 of the present invention illustrating the basic principles thereof. It should be understood that FIG. 1 includes only the uppermost copper metal levels of an integrated circuit device of largely arbitrary design. That is, the integrated circuit device below the level indicated by angled arrow 20 is formed by a process of record including copper interconnects and the design, layout and collective function of the active or passive devices (exemplified by fuse 15) of the integrated circuit below this level are not important to the practice of the invention.

Figure 2:
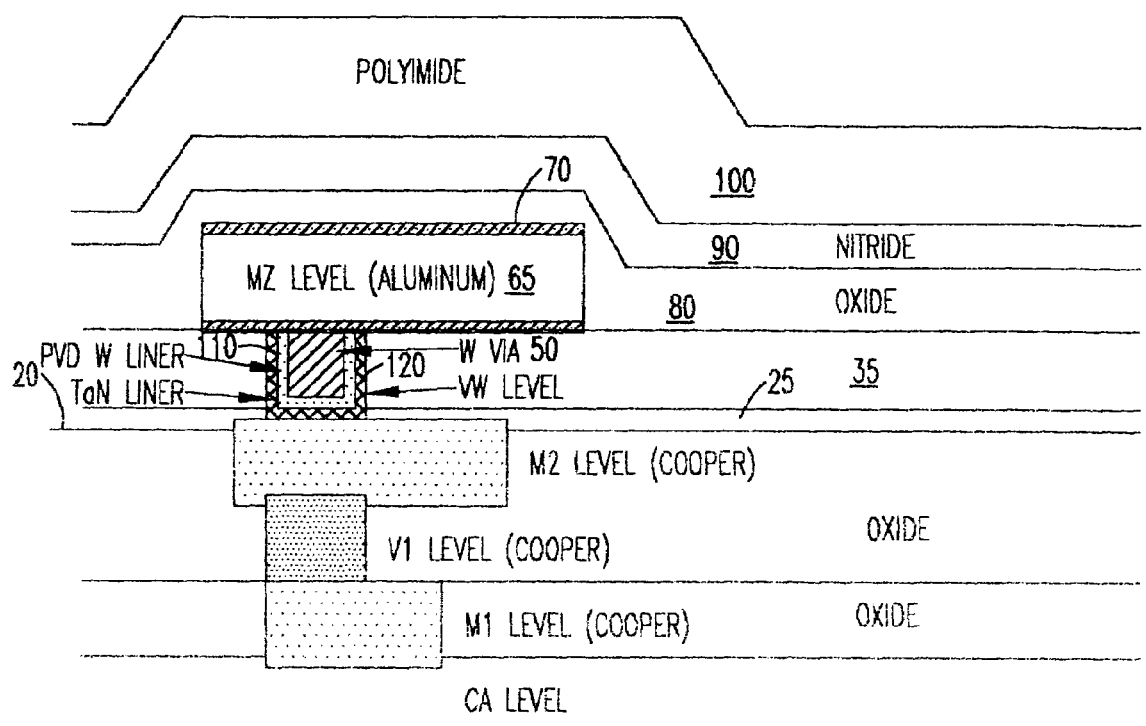
FIG. 2 is a cross-sectional view of a preferred embodiment of the invention.

However, it should be clearly understood that while a portion of the structure illustrated in FIGS. 1 and 2 is formed by a process of record and does not directly include the invention, no portion of FIG. 1 or 2 is admitted to be prior art as to the present invention. On the contrary, entire integrated circuits and/or packaging therefor obtain unexpected advantages from inclusion of the invention and thus similarly embody the invention.

This integrated circuit structure is covered with a barrier layer 25 such as nitride which prevents diffusion of contaminants such as oxygen from higher levels or even the environment of the chip. The nitride barrier layer is then covered with an insulator layer 35 of, for example, oxide, low dielectric constant (low-k) material or the like as may be desired or required by the electrical characteristics necessitated by the design. The low-k material and the barrier layer are then patterned to open the insulator and nitride layer where connections are to be made. However, in accordance with the invention, the opening need not be large as in known copper to aluminum interface structures but can be dimensioned in accordance with known via/stud structures.

This via/stud opening in then lined with a conductive material which can also serve as a barrier to reactant materials such as tungsten fluoride which will be used in subsequent processes. The material forming liner 40 can be any material or combination of materials such as layers of titanium and titanium nitride or PVD tungsten which has low electrical resistivity, good adhesion to both copper and tungsten as well as to oxide and good barrier properties against interdiffusion of copper and tungsten (or other stud material) and tungsten fluoride attack. Any substantially isotropic deposition or growth process is suitable for formation of liner 40.

The via/stud opening thus lined with liner 40 can then be filled with metal, preferably tungsten, to form stud 50 and covered with a layer 60 of, preferably, a titanium nitride adhesion layer and an aluminum metal layer 65 which can then be patterned as desired, to form interconnection wiring and/or solder or wire bond pads. Freedom of design in such patterning is supported by the small via/stud area 40, 50 which is much smaller than the aluminum via previously known for integration of copper and aluminum. Therefore, features patterned in the first aluminum layer can be comparable in size to features in any copper layer and both connection pads and interconnect wiring can thus be included within the same aluminum layer. Doing so allows not only elimination of an aluminum layer but permits interconnect wiring to be performed in an aluminum layer with substantial process time reduction compared to a copper interconnect layer.

The device is then completed by provision of suitable insulating, passivation and/or protective layers, preferably in a sequence of layer 80 of TEOS oxide (or, preferably, a silane-based high density plasma oxide), a nitride layer 90 and a polyimide layer 100 which may be photosensitive or not, as desired. A photosensitive polyimide is often preferred, however, when aluminum wiring level 65 includes solder or wire bond pads 105, as shown in FIG. 1. A further titanium nitride layer 70 can also be placed over the aluminum features 65, if desired for enhancement of adhesion to layer 80 or otherwise provide protection or enhancement of conduction characteristics of aluminum features but may be removed in the solder or wire bond areas.

Once the integrated circuit design has been formed and the barrier (e.g. nitride) layer 25 formed, an insulator layer 35 of a material supporting the formation of Damascene vias is applied. Many suitable materials such as oxides and low-k materials are known to those skilled in the art. The insulator and barrier layers 35, 25 are preferably opened using a reactive ion etch (RIE) to form via openings 30.

Tantalum nitride liner 110 is preferably formed by a PVD process using DC target power of between about 0.5 and 4.0 KW, an argon gas flow of between about 20 and 150 Sccm and a nitrogen gas flow of between about 10 and 81 Sccm corresponding to pressures between about 1.0 and 10.0 mTorr. Ionized PVD having similar DC power, RF coil power between about 0.5 to 4.0 KW and wafer bias power ranging from zero to 450 Watts, argon gas flow of about 10 and 150 Sccm and nitrogen gas flow of about 10 to 80 Sccm corresponding to pressures of between about 1.0 and 40.0 mTorr can also be used. Such a process favors deposition on horizontal surfaces to deposition on vertical surfaces and is preferably carried out to a thickness of between 10 and 200 Angstroms at the bottom of the via/stud opening and between about 10 to 100 Angstroms on the sides.

Deposition of tungsten layer 120 is preferably performed to a similar thickness by a PVD or ionized PVD process under similar conditions to those used for tantalum nitride. The remainder of the via/studs opening can then be filled with tungsten by any known process and the tungsten polished back to the surface of insulator 35. A thin polish stop of, for example, nitride, can be used to facilitate this process, if desired. The aluminum layer 65 (preceded and/or followed by titanium and/or titanium nitride to form a stack structure, if desired) can then be formed and patterned and the device completed as discussed above.

In view of the foregoing, it is seen that the invention provides a copper to aluminum interface structure which allows interconnections and/or solder or wire bond pads to be formed in the same layer, allowing substitution of a layer of aluminum interconnects for a layer of copper interconnects. These simplifications of integrated circuit structure improve performance and significantly reduce fabrication time and increase tool throughput; thus reducing integrated circuit costs. These meritorious effects are achieved while avoiding deleterious effects of process materials on copper which can compromise performance and/or reliability of the integrated circuit.

While the invention has been described in terms of a single preferred embodiment, those skilled in the art will recognize that the invention can be practiced with modification within the spirit and scope of the appended claims.

The invention claimed is:

1. A method of forming an interface structure between copper and aluminum metallurgy layers in an integrated circuit, said method comprising steps of
    covering a copper metallurgy layer with an insulator,
    forming an opening through said insulator to said copper metallurgy layer,
    forming a liner of a conductive barrier material in said opening for protecting said copper metallurgy layer at a bottom of said opening, and
    filling a remainder of said opening with a conductive material to form a stud, and
    forming a patterned aluminum metallurgy layer over said stud.

2. A method as recited in claim 1, wherein said step of forming a liner includes the further steps of chemical vapor deposition of tantalum nitride and tungsten, respectively.

3. A method as recited in claim 1, including the further step of
    forming a covering layer over said patterned aluminum layer.

4. A method as recited in claim 4, wherein said covering layer includes a layer of silane-based high density plasma oxide.

5. A method as recited in claim 1, wherein said patterned aluminum layer includes interconnects and solder or wire bond connection pads, said method including the further step of
    opening said covering layer at a said solder or wire bond connection pad.

6. A method as recited in claim 1, including the further step of forming a barrier layer over said copper metallurgy layer.

7. A method as recited in claim 1 wherein said step of forming a patterned aluminum layer includes forming a connection pad and a wiring connection.

* * * * *